United States Patent
Young et al.

[11] Patent Number: 6,038,383
[45] Date of Patent: Mar. 14, 2000

[54] METHOD AND APPARATUS FOR DETERMINING SIGNAL LINE INTERCONNECT WIDTHS TO ENSURE ELECTROMIGRATION RELIABILITY

[75] Inventors: Duane J. Young, Sugarland; Francisco A. Cano, Missouri City; Nagaraj N Savithri, Dallas; Haldun Haznedar, Missouri City, all of Tex.

[73] Assignee: Texas Instruments Incorporated, Dallas, Tex.

[21] Appl. No.: 08/949,307

[22] Filed: Oct. 13, 1997

[51] Int. Cl.$^7$ ............................................. G06F 17/50
[52] U.S. Cl. .................. 395/500.06; 395/500.35; 395/500.11; 395/500.13
[58] Field of Search ............... 395/500.02, 500.05, 395/500.06, 500.09, 500.11, 500.34, 500.35, 500.13, 500.3, 500.1; 364/468.28

[56] References Cited

U.S. PATENT DOCUMENTS

| | | | |
|---|---|---|---|
| 5,349,542 | 9/1994 | Brasen et al. | 364/578 |
| 5,404,310 | 4/1995 | Mitsuhashi | 364/490 |
| 5,410,490 | 4/1995 | Yastrow | 395/500.06 |
| 5,446,676 | 8/1995 | Huang et al. | 364/578 |
| 5,535,370 | 7/1996 | Raman et al. | 395/500.02 |
| 5,537,328 | 7/1996 | Ito | 395/500.02 |
| 5,553,008 | 9/1996 | Huang et al. | 364/578 |
| 5,581,475 | 12/1996 | Majors | 364/491 |
| 5,598,348 | 1/1997 | Rusu et al. | 364/497 |
| 5,648,910 | 7/1997 | Ito | 395/500.03 |
| 5,737,580 | 4/1998 | Hathaway et al. | 395/500.13 |
| 5,768,145 | 6/1998 | Roethig | 364/488 |
| 5,828,580 | 10/1998 | Ito | 395/500.13 |
| 5,831,867 | 11/1998 | Aji et al. | 364/489 |
| 5,835,380 | 11/1998 | Roethig | 395/500.03 |
| 5,872,952 | 2/1999 | Tuan et al. | 395/500.35 |

OTHER PUBLICATIONS

Bakoglu, H.B., *Circuits, Interconnections, and Packaging for VLSI*, Addison–Wesley Pub. Co., pp. 53–55, no date.
Black, J.R., *Electromigration Failure Modes in Aluminum Metallization for Semiconductor Devices*, Proc. IEEE, vol. 57, No. 9, Sep. 1969, pp. 1587–1594.

(List continued on next page.)

*Primary Examiner*—Kevin J. Teska
*Assistant Examiner*—Leigh Marie Garbowski
*Attorney, Agent, or Firm*—Gerald E. Laws; Robert D. Marshall, Jr.; Richard L. Donaldson

[57] ABSTRACT

A method for designing and fabricating an integrated circuit is disclosed. Signal line interconnect widths are determined by performing an electromigration analysis on a trial layout of the integrated circuit. A representative circuit for an integrated circuit is designed and a trial layout is created that includes a plurality of nets. A preprocessor 505 eliminates nets that do not need further validation. An extraction process 510 generates an RC network representation of each remaining net that is to be validated to form a distributed load simulation model. Distributed capacitance and resistance of signal lines is included with load capacitance of receivers to provide an accurate profile of current flow. A profile of current flowing in the signal line of each net is determined by simulating the operation of each net using simulator 517. Peak current, RMS current and average current is determined. Post processor 520 determines if electromigration parameters are violated based on the current profile determined for each net. Widths for various segments of signal lines in the various nets are selected to be greater than or equal to a minimum width determined by post processor 520.

22 Claims, 7 Drawing Sheets

OTHER PUBLICATIONS

Ting, L.M., et al., *AC Electromigration Characterization and Modeling of Multilayered Interconnects*, Proc. Of the 31$^{st}$ Annual Int'l Reliability Physics Symposium, 1993, pp. 311–316.

Maiz, J.A., *Characterization of Electromigration Under Bidirectional (BC) and Pulsed Unidirectional (PDC) Currents*, Proc. Of the 27$^{th}$ Annual Int'l Reliability Physics Symposium, 1989, pp. 220–228.

Scarpulla, John, et al., *Reliability of Metal Interconnect After a High–Current Pulse*, IEEE Electron Device Letters, vol. 17, No. 7, Jul. 1996, pp. 322–324.

Marguia, J.E., et al., *Short–Time Failure of Metal Interconnect Caused by Current Pulses*, IEEE Electron Device Letters, vol. 14, No. 10, Oct. 1993, pp. 481–483.

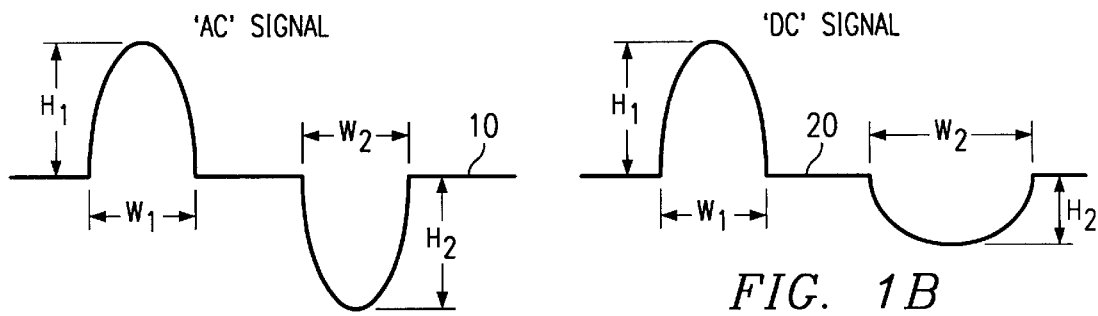
FIG. 1A
FIG. 1B
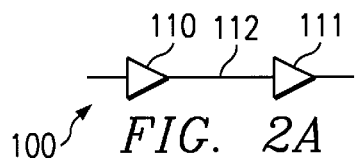
FIG. 2A
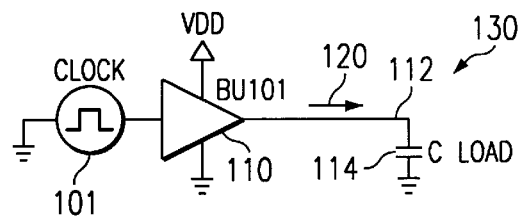
FIG. 2B
(PRIOR ART)
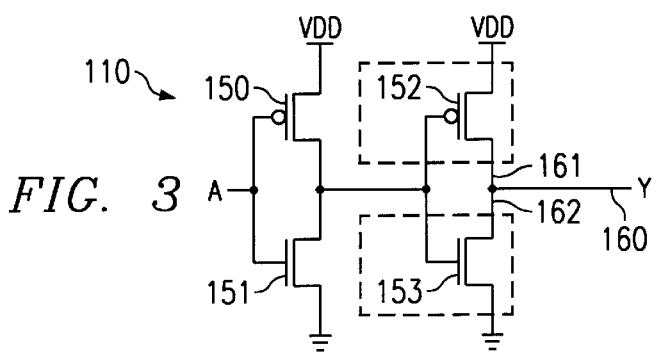
FIG. 3
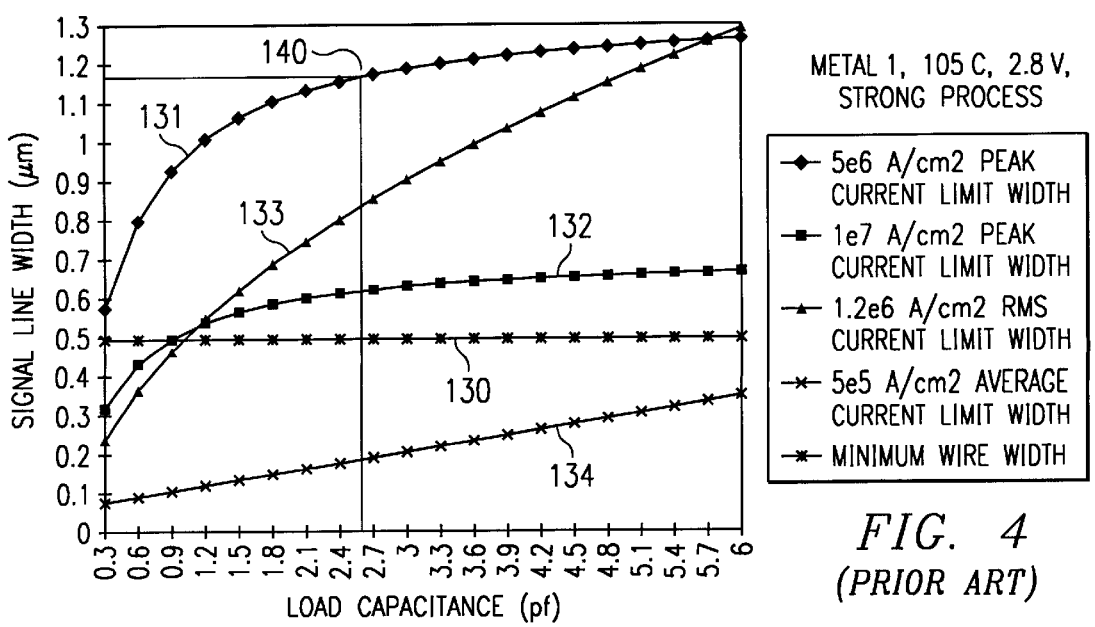
FIG. 4
(PRIOR ART)

METHOD AND APPARATUS FOR DETERMINING SIGNAL LINE INTERCONNECT WIDTHS TO ENSURE ELECTROMIGRATION RELIABILITY

FIELD OF THE INVENTION

This invention relates to integrated circuits, and in particular, to designing an integrated circuit to ensure that electromigration does not reduce reliability of the integrated circuit.

BACKGROUND OF THE INVENTION

Aluminum is the preferred metal for VLSI interconnections because of its low resistivity, good adherence to Si and $SiO_2$ layers, bondability, patternability, and ease of deposition (as a result of its low melting point). In addition, aluminum can be easily purified so that it does not contaminate the IC with undesirable impurities, and it is a readily available, low-cost material. In spite of its positive qualities, aluminum interconnections introduce many reliability problems, such as electromigration, contact failures, and step coverage.

Electromigration is one of the major interconnection failure mechanisms in VLSI integrated circuits. It is caused by the transport of the metal atoms when an electric current flows through the wire. This migration is a result of the interaction between the aluminum atoms and the electron current. As the atoms collide with the drifting electrons, the metal atoms are transported primarily by grain boundary diffusion. Because of its low melting point, aluminum has a large grain boundary self-diffusion constant, which increases its electromigration liability. When the metal atoms are displaced, the line may eventually break, and undesirable opens may be formed, or two neighboring lines can get shorted if material accumulated as a result of electromigration forms a bridge between the lines.

Electromigration-induced mass transport phenomena increase with current density and temperature. As the minimum feature size is scaled down, MTTF degrades rapidly because interconnect width and thickness are reduced and current density is increased.

There are a number of ways to minimize the electromigration rate. If the grain size is comparable to interconnection width and thickness, the electromigration rate is reduced because the self-diffusion path through grain boundaries is eliminated. An aluminum line with large grains can assume a bamboo-like structure. A more common way to reduce electromigration is the addition of alloying elements, which block the grain boundary diffusion path by precipitating at the grain boundary. Addition of 2 to 4 percent of copper to aluminum is shown to provide significant electromigration resistance. When silicon is alloyed with copper, however, it becomes difficult to dry etch, it corrodes more easily, its resistivity increases, and hillocks are not completely eliminated. Layered films, a recently developed technology in which layers of Al/Si are sandwiched between titanium or tungsten layers, promise to reduce electromigration, eliminate hillock formation, and produce low-resistivity lines that can be dry etched.

Regardless of the method of controlling electromigration, a method of determining when an interconnect line may be subject to electromigration is needed, which is provided by an aspect of the present invention.

Other objects and advantages will be apparent to those of ordinary skill in the art having reference to the following figures and specification.

SUMMARY OF THE INVENTION

In general, and in a form of the present invention a method for designing an integrated circuit which has at least one driver circuit that is operable to drive a signal line is provided. The method begins by creating a trial layout for the driver circuit and the signal line and assigning a preselected width to the signal line. A profile of a current which will flow in the signal line during operation of the integrated circuit is then determined by simulating the operation of the trial layout using a distributed load simulation. Based on the simulated profile, a minimum width for the signal line is selected to maintain electromigration at an acceptable level. The trial layout is then modified based on minimum width to create a final layout.

In another form of the present invention, the trial layout is modified preselected by changing an impedance of the signal line.

In another form of the present invention, the signal line can be analyzed as several segments, including line segment, vias and contacts, and each segment can be assigned a different minimum width based on the profile of current in each segment.

In another form of the present invention, an integrated circuit can be fabricated according to the modified trial layout.

In another form of the present invention, a computer system includes a design program for designing an integrated circuit by first creating a trial layout for the driver circuit and the signal line and assigning a preselected width to the signal line. A profile of a current which will flow in the signal line during operation of the integrated circuit is then determined by simulating the operation of the trial layout using a distributed load simulation. Based on the simulated profile, a minimum width for the signal line is selected to maintain electromigration at an acceptable level. The trial layout is then modified based on minimum width to create a final layout.

In another form of the present invention, a diskette includes a design program for designing an integrated circuit by first creating a trial layout for the driver circuit and the signal line and assigning a preselected width to the signal line. A profile of a current which will flow in the signal line during operation of the integrated circuit is then determined by simulating the operation of the trial layout using a distributed load simulation. Based on the simulated profile, a minimum width for the signal line is selected to maintain electromigration at an acceptable level. The trial layout is then modified based on minimum width to create a final layout.

In another form of the present invention a pre-layout estimate of the signal routing topology is simulated to determine a 'correct by construction' initial layout. In this form, the estimation parameters for the interconnect capacitance and resistance are sufficiently pessimistic to guarantee correct layout on the first route.

Other embodiments of the present invention will be evident from the description and drawings.

BRIEF DESCRIPTION OF THE DRAWINGS

Other features and advantages of the present invention will become apparent by reference to the following detailed description when considered in conjunction with the accompanying drawings, in which:

FIG. 1A is a waveform illustrating a symmetric AC signal;

FIG. 1B is a waveform illustrating an asymmetric AC signal;

FIG. 2A is a schematic of a simple circuit to illustrate electromigration analysis;

FIG. 2B is a prior art SPICE model for electromigration analysis;

FIG. 3 is a schematic of a buffer, BU101, which is included in a design library;

FIG. 4 is a plot of signal line width versus load capacitance for the circuit of FIG. 2, according to prior art;

FIG. 6A is a schematic of a circuit which includes a buffer, several receivers and a signal line interconnect in between;

Corresponding numerals and symbols in the different figures and tables refer to corresponding parts unless otherwise indicated.

DETAILED DESCRIPTION OF PREFERRED EMBODIMENTS OF THE INVENTION

Figure 5A:
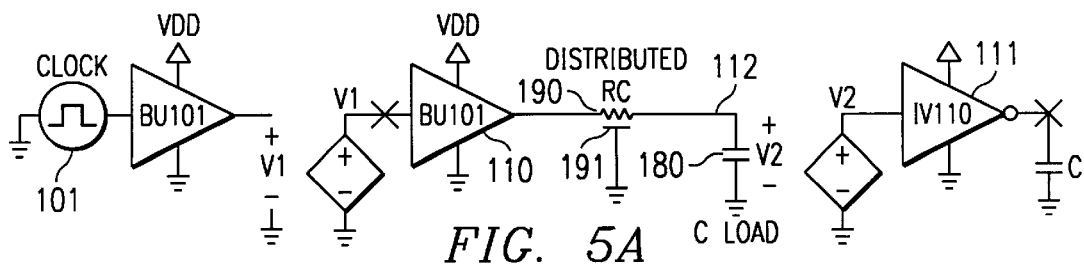
FIG. 5A is a SPICE analysis circuit using a distributed RC model for signal line interconnects.

Aspects of the present invention include methods for designing an integrated circuit. In the following description, specific information is set forth to provide a thorough understanding of the present invention. Well known circuits and devices are included in block diagram form in order not to complicate the description unnecessarily. Moreover, it will be apparent to one skilled in the art that specific details of these blocks are not required in order to practice the present invention. Specific process parameters discussed in the following description relate to a specific integrated circuit fabrication process referred to as "25c10.c CMOS Technology." For other CMOS processes, the value of the various parameters may change, but innovative aspects of the present invention are applicable to a wide spectrum of CMOS processes.

It has been determined that Electromigration (EM) can be one of the major interconnection failure mechanisms and is caused by the mass transport of metal-ions under the influence of an "Electron wind". EM failure results from the flux divergence of the migrating ions and is accelerated by current density and temperature. The electromigration guidelines in Table 1 cover the basic principles of designing -in- reliability to ensure at least a 50 FIT (failures in a thousand) average failure rate goal over 10 years (or 87,600 power-on-hours) of operating life. The following definitions are used throughout this specification:

a) peak current: Largest absolute value in waveform (positive or negative);

b) Bamboo: refers to lines with width much smaller than grain size. The majority of grain boundaries tend to be perpendicular to the long dimension of a signal line. Bamboo metal lines have a higher resistance to metal migration, thus a metal line which is formed with a bamboo width can carry a higher current density than a wider line without suffering EM problems. In the present CMOS process, the AlCu grain size is approximately 1 $\mu$m; thus, an AlCu signal line having a line width of approximately 0.5 $\mu$m or less is designated as a "bamboo line";

c) Average Current: For bidirectional currents, electrons flowing in opposite directions provide a repairing effect due to a sweep back phenomena. A set of equations for calculating average current is as follows:

$I_{avg+}$=average($I_{inst+}$)

$I_{avg-}$=average($I_{inst-}$)

$I_{avg}$=max($I_{avg+}$, $-I_{avg-}$)$-r$*min($I_{avg+}$, $-I_{avg\ -}$)

Where:

r=0.5 (conservative value)

$I_{inst+}$ is the positive portion of the instantaneous current $I_{inst-}$ is the negative portion of the instantaneous current $I_{avg}$ is the average current calculated with a recovery coefficient If a cell has multiple input combinations for rising and falling output transitions, then taking the average of the entire vector set would result in averaging the smaller pulses with the larger pulses. If the larger pulses occur as the predominant operation mode, then the part would be under designed.

To get around this, the EM validation flow calculates an average current for each cycle of input transitions, $I_{avg+}$ and $I_{avg-}$, and then calculates $I_{avg}$ using largest magnitude $I_{avg+}$ and $I_{avg-}$ values. This essentially is making the assumption that the worst case pulses follow each other. In actuality, this may be impossible but it is always a pessimistic assumption.

d) RMS current: AC RMS or DC RMS: "AC" RMS is applied when positive and negative pulses are within 90% match for height and width. Referring to FIG. 1A, when height $H_1$ is within 90% of height $H_2$ and width $W_1$ is also within 90% of width $W_2$, then signal 10 is classified as a symmetrical AC signal and referred to as an "AC RMS" signal. A signal that is not a symmetrical AC signal is classified as an asymmetrical AC signal and referred to as a "DC RMS" signal, such as signal 20 illustrated in FIG. 1B. A set of equations for calculating RMS current is as follows:

$I_{rms+} = \text{sqrt}(\text{average}(I_{inst+}^2))$
$I_{rms-} = \text{sqrt}(\text{average}(I_{inst-}^2))$
$I_{rms} = \text{sqrt}(((I_{rms+})^2 + (I_{rms-})^2)/2)$ If a cell has multiple input combinations for rising and falling output transitions, then taking the RMS of the entire vector set would result in averaging the smaller pulses with the larger pulses. If the larger pulses occur as the predominant operation mode, the part would be under designed.

To get around this, the EM validation flow calculates an RMS current for each cycle of input transitions, $I_{rms+}$ and $I_{rms-}$, and then calculates $I_{rms}$, the "average" RMS current, using the largest RMS values of $I_{rms+}$ and $I_{rms-}$. This is essentially making the assumption that the worst case pulses follow each other. In actuality this may be impossible but it is always a pessimistic assumption.

e) Minimum Width Required: signal line width required to satisfy peak, RMS, and average current densities concurrently;

f) Width Reduction: due to process line width control variation:

(Target Width )—( Lower Spec Limit Width)

Width reduction can also be defined as (Target Width)—(Upper Spec Limit) In which case it would have a negative value. This is important because as the line gets wider the capacitance goes up in a super linear fashion while the current density decreases only linearly.

Worst case values are used in EM analysis. For the 25c10.c process, five metal layers are used. For metal layers 1,2,3,4: 0.06 μm, for metal layer 5: 0.33 μm.

TABLE 1

Maximum Current Density Limits

| | |
|---|---|
| Peak Current | Width >0.5 μm: 5e6 A/cm$^2$ |
| | Width <= 0.5 μm: 1e7 A/cm$^2$ |
| Average Current | 5e5 A/cm$^2$ |
| "DC" RMS Current | Metal 1,2,3: 1.2e6 A/cm$^2$ |
| | Metal 4: 1.0e6 A/cm$^2$ |
| | Metal 5: 0.8e6 A/cm$^2$ |
| "AC" RMS Current | Metal 1,2,3: 2.5e6 A/cm$^2$ |
| | Metal 4: 2.0e6 A/cm$^2$ |
| | Metal 5: 1.4e6 A/cm$^2$ |

Due to the sweep back effects a conditional relaxation to the DC RMS limit in Table 1 can be made IF the bipolar pulses are pure AC. Pure AC, in this document, is defined to be "special" cases of bipolar pulses in which the smaller negative peak is not less than 90% of the larger positive peak and the duration of the smaller negative pulse is within 90% of the positive pulse. The characterization of the recovery coefficient is based on "Pure AC" where both positive pulses and negative pulses are equal.

There is also some conditional relaxation to the general rule for peak current that can be applied to signal lines of less than 0.5 μm width. The grain size of the aluminum interconnect is approximately 1um. For line widths of less than 0.5 μm this grain structure is referred to as being in "Bamboo". Under these conditions it is permissible for the peak current density to be increased to 1.0E7 A/cm$^2$. Note that this relaxation is not allowed if the junction temperature exceeds 105 deg C."

Each metal layer comprises a sandwich of two layers of TiN with a layer of Al-Cu(0.5%) between them. TiN and Ti:W layers in each metal layer reduce electromigration but, due to the resistance of these layers, nearly all of the current flows in the Al-Cu. For this reason, the thickness of the TiN or Ti:W layers are not included in electromigration analysis and all the current is assumed to flow in the Al-Cu. Table 2 defines the conditions used for EM analysis.

TABLE 2

Analysis Conditions

Stringent Conditions
    Lower spec limit metal line thickness - AlCu only
        Metal 1,2,3,4,5200 Å
        Metal 5 10400 Å
    where: V = 2.8 V, T = 105 C (25c10.c Strong process)
Conditions Used
    3 Sigma thinnest metal line thickness - AlCu only
        Metal 1 5915 Å
        Metal 2,3,4 6006 Å
        Metal 5 10920 Å
    where: V = 2.5 V, T = 105 C( 25c10.c Strong process)

Combining the maximum current density limits of Table 1 with the analysis conditions of Table 2 results in current density rules that can be easily applied to various signal line interconnect widths. These numbers are obtained by multiplying the current density by the metal line thickness. Table 3 provides peak current density rules, Table 4 provides RMS current density rules and Table 5 provides average current density rules. The average current density rules of Table 5 are determined from a bi-directional current average set by the sweepback equation discussed earlier.

TABLE 3

Peak Current Density Rules

Non-Bamboo Lines (width >0.5 μm)
    Metal 1: 29.57 mA/(μm width)
    Metal 2,3,4: 30.03 mA/(μm width)
    Metal 5: 54.60 mA/(μm width)
Bamboo Lines (width <= 0.5 μm)
    Metal 1: 59.15 mA/(μm width)
    Metal 2,3,4: 60.06 mA/(μm width)
    Metal 5: 109.20 mA/(μm width)

TABLE 4

RMS Current Density Rules

'DC' Signals
    Metal 1: 7.098 mA/(μm width)
    Metal 2,3: 7.207 mA/(μm width)
    Metal 4: 6.006 mA/(μm width)
    Metal 5: 8.736 mA/(μm width)
'AC' Signals
    Metal 1: 14.787 mA/(μm width)
    Metal 2,3: 15.015 mA/(μm width)
    Metal 4: 12.012 mA/(μm width)
    Metal 5: 15.288 mA/(μm width)

TABLE 5

Average Current Density Rules

Metal 1: 2.957 mA/(∞m width)
    Metal 2,3,4: 3.003 mA/(μm width)
    Metal 5: 5.460 mA/(μm width)

Electromigration analysis has been done using lumped load circuit models. FIG. 2A is a schematic of a simple circuit 100 which has a driver 110, a receiver 111, and a signal line 112 connected between. FIG. 2 is a prior art SPICE model 130 of circuit 100 for electromigration analysis. SPICE is a known simulation program, and will not be described further here. A buffer 110 is connected to a receiver which is represented by capacitive load 114. Buffer 110 is of a type BU101, which is a pre-designed buffer selected from a cell library. Signal line interconnect 112 provides the connection. Capacitance of signal line 112 is included as a lumped load within the load 114. A current 120 will flow through signal line 112 in response to an input signal provided by 100 MHz clock circuit 101. A peak value, an RMS value, and an average value for current 120 is determined by simulating the operation of SPICE model 130.

FIG. 3 is a schematic of a buffer cell, BU101, which is included in a design library. Buffer cell BU101 was selected to form buffer 110 in FIG. 2. Electromigration considerations regarding buffer BU101 will be discussed later.

FIG. 4 is a plot of signal line width versus load capacitance for the circuit of FIG. 2, according to prior art. For a selected lithography process, a minimum line width is specified, such as 0.5 $\mu$m (micro-meter) as illustrated by line 130. Note that for the present process, 0.5 $\mu$m width is also the a bamboo width. In order to remain below 5e6 A/cm$^2$ for peak currents, a line width indicated by plot line 131 must be selected. Alternatively, for smaller loads a higher density of 1e7 A/cm$^2$ for peak currents can be selected as long as the required signal line width is below the bamboo line width of 0.5 $\mu$m, as indicated by plot line 132. Thus for loads of up to approximately 0.9 pf, a line width of 0.5 is allowable. An RMS current limit of 1.2e6 A/cm$^2$ is illustrated by plot line 133, and an average current limit of 5e5 A/cm$^2$ is illustrated by plot line 134. Thus, for a load of 2.6 pf, for example, a minimum line width of approximately 1.2 $\mu$m is required, as indicated by intersection 140 when the prior art lumped load analysis is performed. Circuit 100 would be laid out using a signal line width, also referred to as a track width, of 1.2 $\mu$m according to prior art electromigration analysis.

According to an aspect of the present invention, it has been determined that a lumped load simulation does not provide an accurate profile of current flow when the width of a track falls below approximately 2 $\mu$m in the present 25c10.c CMOS process. While this value may vary for another process, various advantageous concepts of the present invention will still be applicable for another process with different parameters. Inaccuracy of a lumped load analysis is due to a damping effect of the resistance, or other impedance, of the signal line. Therefore, according to an aspect of the present invention, a trial layout of circuit 100 is created using a preselected signal line width prior to performing electromigration analysis. The preselected width can be a minimum width for the fabrication process, for example. Alternatively, the preselected width can be a width associated with a current drive capacity of buffer 110. Alternatively, the preselected width can be selected based on a prior art electromigration analysis, as described above. Other techniques or rules of thumb can be used to select the preselected width.

FIG. 5A is a SPICE analysis circuit using a distributed RC model for signal line interconnects. Signal line 112 is modeled as a resistor 190 and a capacitor 191, which represent the resistance and distributed capacitance, respectively, of signal line 112 in a trial layout of circuit 100 using the preselected track width. Load capacitor 180 is a model of the input load of receiver 111. According to an aspect of the present invention, by modeling signal line interconnect 112 as a resistor and a capacitor, a truer current profile can be determined. FIG. 5A illustrates clock circuit 101 which provides an input signal for buffer 110. Other types of circuits, such as AND gates, NAND gates, etc. will have multiple input signals. Various combinations of input signals are simulated and a worse case output signal on signal line 112 is determined. This worse case signal is used to form the profile of current for electromigration analysis.

Figure 5B:
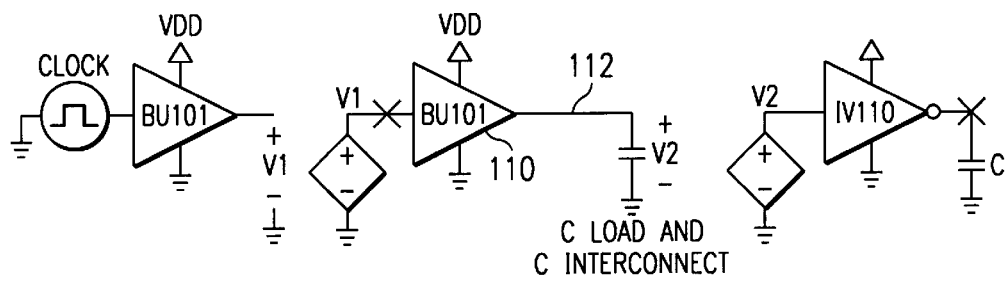
FIG. 5B is a SPICE analysis circuit using a lumped load model for delay timing analysis.

FIG. 5B is a SPICE analysis circuit using a lumped load model for the circuit modeled in FIG. 5A for delay timing analysis.

Figure 6A:
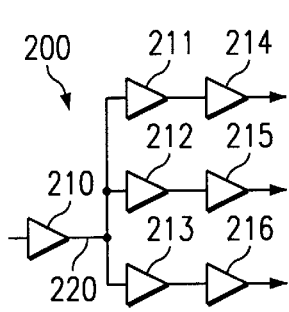
Figure 6B:
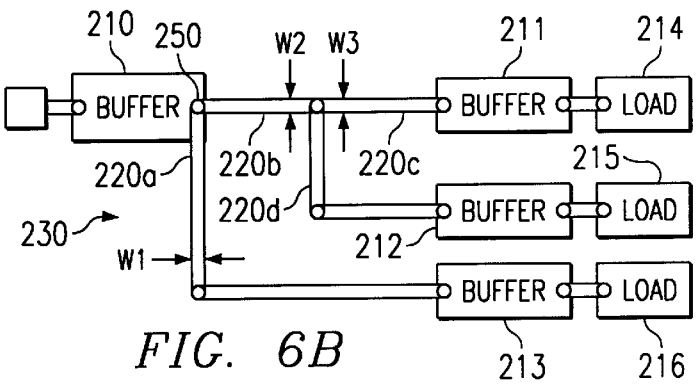
FIG. 6B is a trial layout of buffers, receivers and signal line interconnect, according to the present invention.

FIG. 6A is a schematic of a circuit which includes a buffer circuit 210, several receiver circuits 211–213 and a signal line interconnect 220 in between. This circuit will be used as an example to explain several innovative aspects of the present invention. It is by no means intended to be a limitation on the extent to which the present invention can be applied. According to an aspect of the present invention, a trial layout for an integrated circuit is made as shown in FIG. 6B by preselecting a width for signal line 220a–c, as discussed above. Widths w1, w2, and w3 may be the same preselected value, or they may be different values. After creating the trial layout, a profile of current that would flow in circuit 230 during normal operation of the integrated circuit is determined by simulating the operation of the trial layout using a distributed load simulation.

Figure 7A:
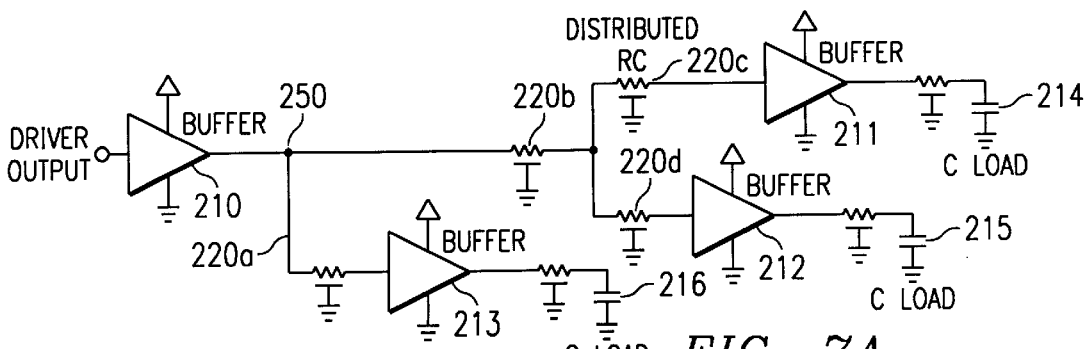
FIG. 7A is a model of the trial layout of FIG. 6B which has several branches showing distributed RC on each portion of the circuit signal line interconnects, according to the present invention.
Figure 7B:
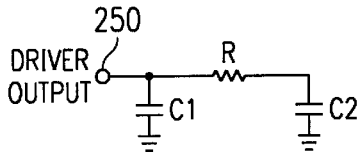
FIG. 7B is a driving point admittance model of the model of FIG. 7A.

FIG. 7A is a simulation model of the trial layout of FIG. 6B which has several branches 220a–d showing distributed RC on each portion of the circuit signal line interconnects, according to the present invention. An aspect of the present invention is that the rather complicated simulation model shown in FIG. 7A can be reduced to a simple driving point admittance (DPA) model illustrated in FIG. 7B. A DPA model is taken with respect to a selected point in a net. In this case, point 250, the output of buffer 210, is selected. Thus, in FIG. 7B point 250 is the output of buffer 210 and resistor R, capacitor C1 and capacitor C2 model the entire net beyond point 250. Values for R, C1 and C2 can be determined in a number of ways, such as by using the known Rice algorithm. A profile of current flowing through point 250 is determined by simulating the operation of buffer 210 with the DPA model of FIG. 7B. A peak current, an RMS current, and an average current is determined as part of the profile of current flow.

Figure 8A:
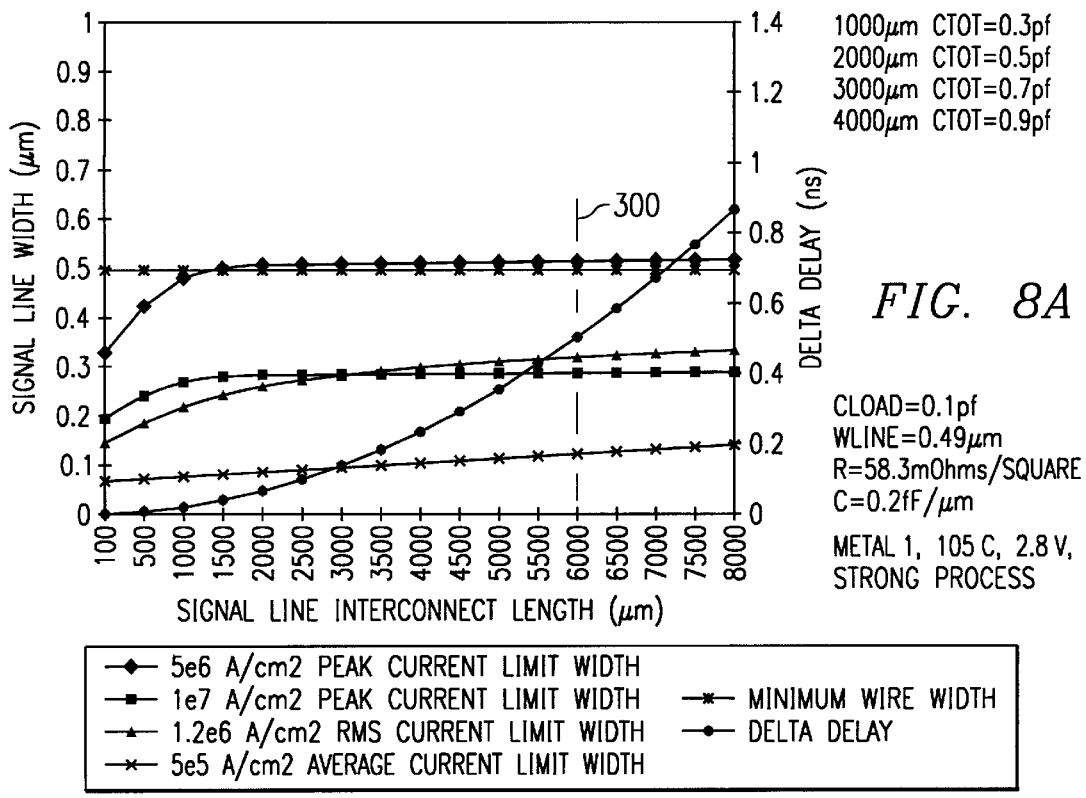
FIG. 8A is a plot of signal line width and delta delay versus signal line interconnect length for the buffer of FIG. 3 with a load of 0.1 pf and a line width of 0.49 $\mu$m, according to the present invention.
Figure 8B:
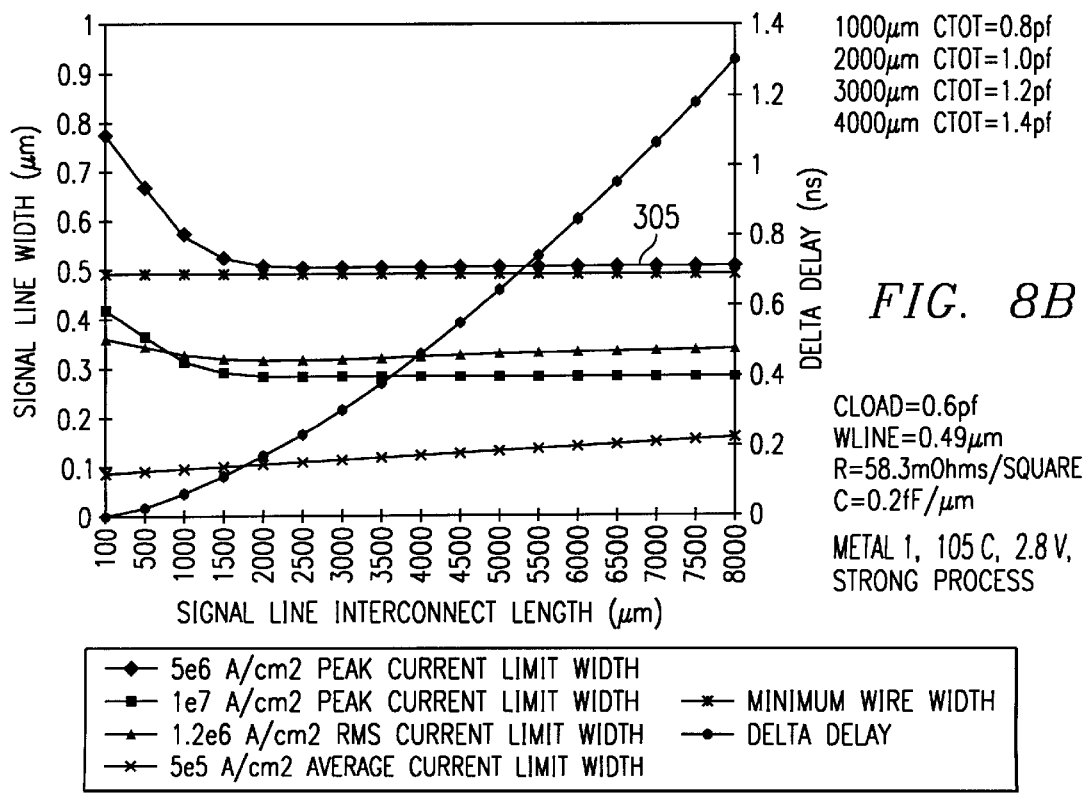
FIG. 8B is a plot of signal line width and delta delay versus signal line interconnect length for the buffer of FIG. 3 with a load of 0.6 pf and a line width of 0.49 $\mu$m, according to the present invention.
Figure 8C:
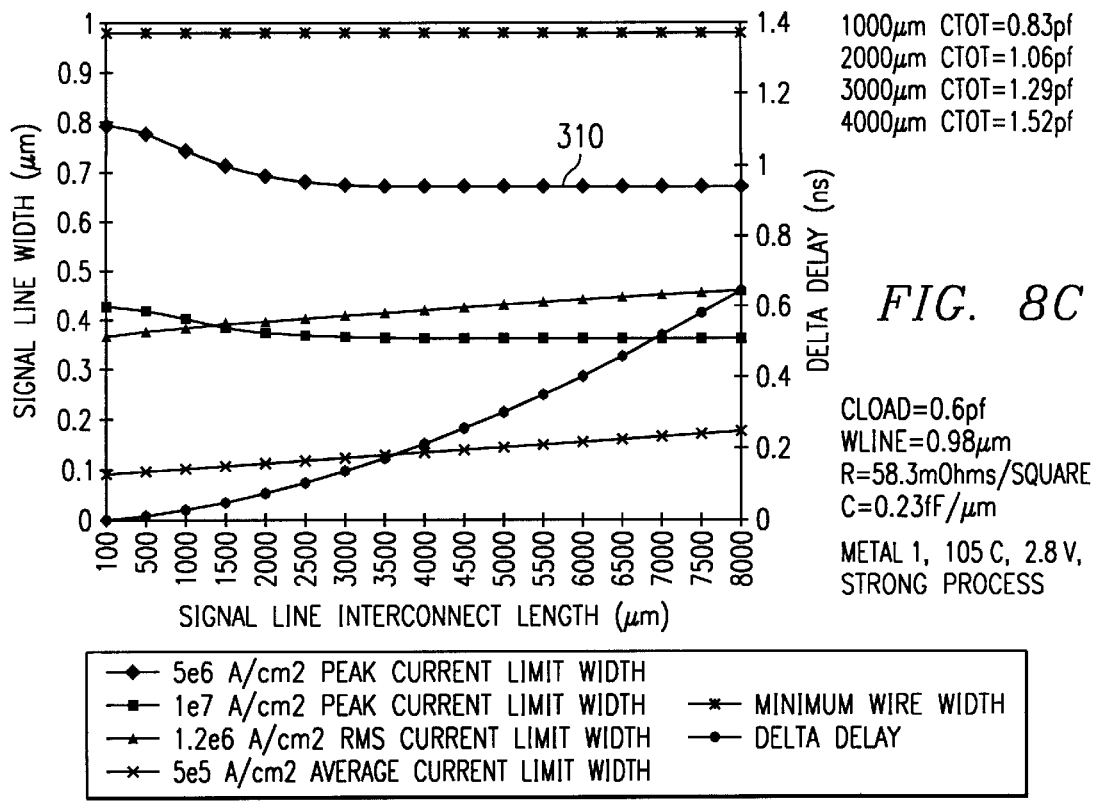
FIG. 8C is a plot of signal line width and delta delay versus signal line interconnect length for the buffer of FIG. 3 with a load of 0.6 pf and a line width of 0.98 $\mu$m, according to the present invention.
Figure 8D:
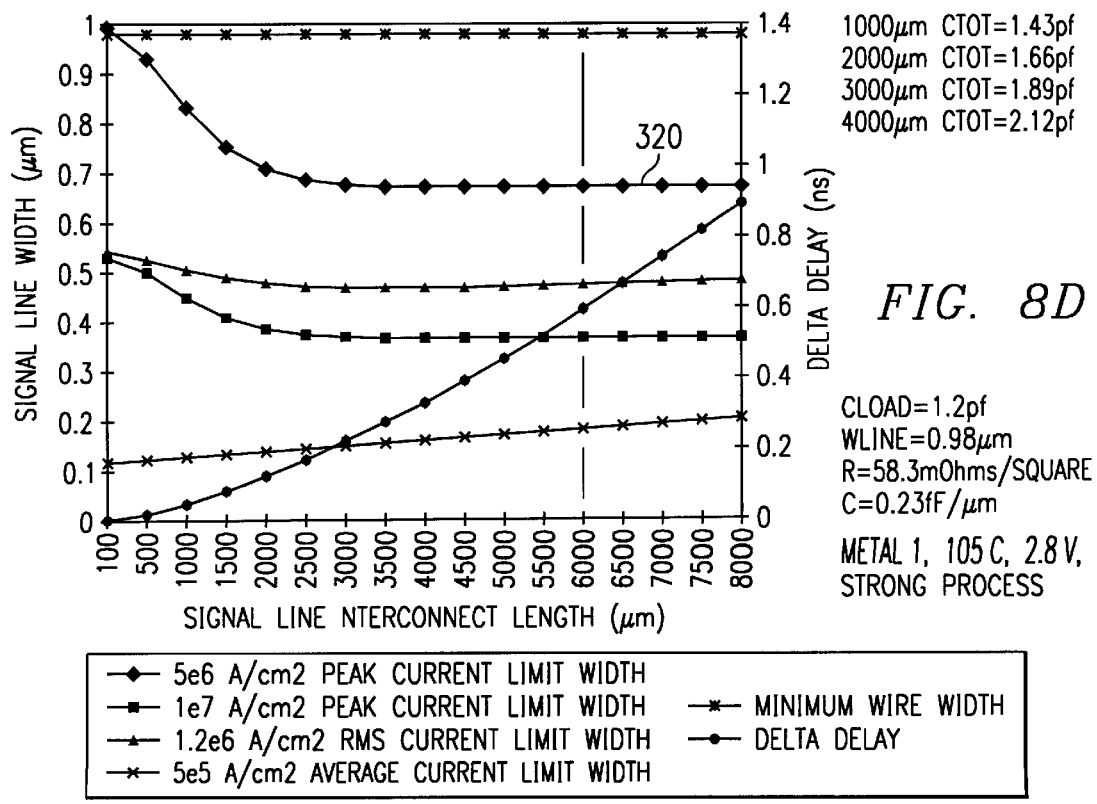
FIG. 8D is a plot of signal line width and delta delay versus signal line interconnect length for the buffer of FIG. 3 with a load of 1.2 pf and a line width of 0.98 $\mu$m, according to the present invention.

FIGS. 8A–8D are plots of various line widths and loads using the current density rules of Tables 3–5, that illustrate advantageous aspects of the present invention. FIG. 8A is a plot of signal line width and delta delay versus signal line interconnect length for the buffer of FIG. 3 with a load of 0.1 pf and a line width of 0.49 $\mu$m, according to the present invention. In this case, a track width of 0.49 was preselected for the trial layout, since this is the minimum track width for the selected fabrication process. For a track length of 6000 $\mu$m, for example, a minimum required width for electromigration assurance is less than the minimum wire width of 0.5 $\mu$m for the process; therefore a 0.5 $\mu$m track width can be used under this load condition. Referring back to FIG. 4, a prior art electromigration analysis would use a lumped load of at least 1.3 pf (1.2 pf for the track capacitance and 0.1 pf load capacitance) which would result in indicating that a track of at least 1.0 $\mu$m width would be required. Advantageously, a much narrower track can be used with assurance that electromigration will not be a problem, according to an aspect of the present invention. FIG. 8B is a plot of signal line width and delta delay versus signal line interconnect length for the buffer of FIG. 3 with a load of 0.6 pf and a line width of 0.49 $\mu$m, according to the present invention. FIG. 8C is a plot of signal line width and delta delay versus signal line interconnect length for the buffer of FIG. 3 with a load of 0.6 pf and a line width of 0.98 μm, according to the present invention. FIG. 8D is a plot of signal line width and delta delay versus signal line interconnect length for the buffer of FIG. 3 with a load of 1.2 pf and a line width of 0.98 μm, according to the present invention. In each case, for similar load conditions, a narrower track width can be advantageously selected using an aspect of the present invention than would by using the prior art analysis of FIG. 4. Alternatively, In the case of design flows with limited track widths, a larger driver can be advantageously selected using an aspect of the present invention than would by using the prior art analysis of FIG. 4.

Note that in FIGS. 8C and 8D, a preselected line width of 0.98 μm was used. Comparing FIG. 8C to FIG. 8B, which both have the same load capacitance, the effect of variation in the track resistance can be seen. In FIG. 8C, the wider preselected track width has a lower resistance than the preselected track width of FIG. 8B, which results in a higher peak current, as indicated by plot line 310 versus plot line 305. FIG. 8C thus indicates that the track width can be reduced below the preselected width of 0.98 μm.

Likewise note in FIG. 8D that peak current plot line 320 indicates that a track width less than the preselected width of 0.98 μm can be used. For a track length of 6000 μm, for example, a track width of less than 0.7 μm can be used. A track length of 6000 μm and a load of 1.2 pf would result in a lumped load of approximately 2.6 pf. Referring again to FIG. 4, a prior art analysis with a lumped load of 2.6 pf would require a track width of approximately 1.2 μm.

Figure 9A:
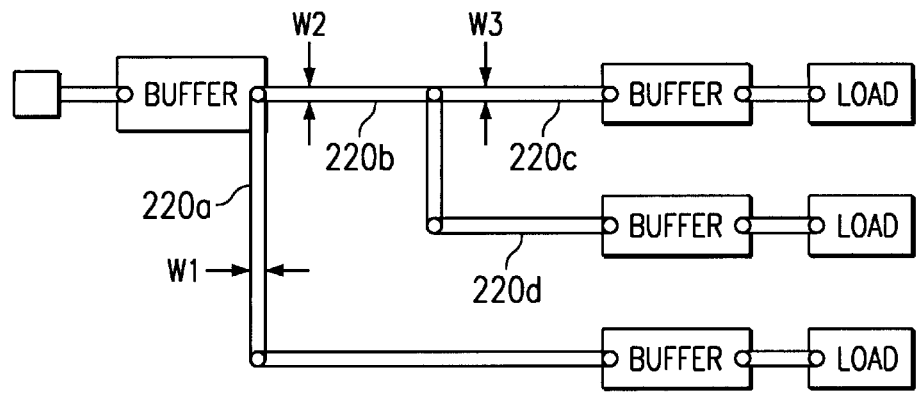
FIG. 9A is a modified trial layout of FIG. 6B with a modified line width, according to the present invention.

FIG. 9A is a modified trial layout of FIG. 6B with a modified line width, according to the present invention. In FIG. 9A, all portions of signal interconnect 220a–d can be modified based on the minimum width required to maintain electromigration at an acceptable level in accordance with the current profile, as discussed above. Thus widths w1, w2 and w3 can be modified to the selected minimum width. However, depending on the layout, even this new selected minimum width may be too pessimistic. Notice that in FIG. 9A a portion of signal line 220, track segment 220a, does not carry any current that travels on track segment 220b. Therefore, track segment 220a and 220b can be analyzed using a separate DPA model for each segment to determine a current profile for each portion of signal line 220. A minimum track width can then be selected for each segment based on these separate current profiles. Likewise, segments 220c and 220d can be analyzed separately to optimize a minimum width selection for each segment.

Alternatively, the entire net of interconnects can be simulated on a segment basis in a single simulation and thus get current waveforms and validation in every segment/VIA without determining a DPA model for each point.

It is noted that a net which has only one receiver can still be considered as having segments, since the EM validation flow is checking current density at a particular points in the entire signal line. Even in the DPA mode, the flow is calculating the required width at the point of connection to the driver. Furthermore, a net which has no receivers, such as an antenna, may be analyzed using the EM validation flow.

In the EM validation flow, a segment of the signal line is a portion over which the change in properties is small enough that the segment can be modeled as a single CRC (pi) network. These changes in properties include but are not limited to, resistance, capacitance, inductance, routing layer, current capacity, tapping for a branch etc.

Figure 9B:
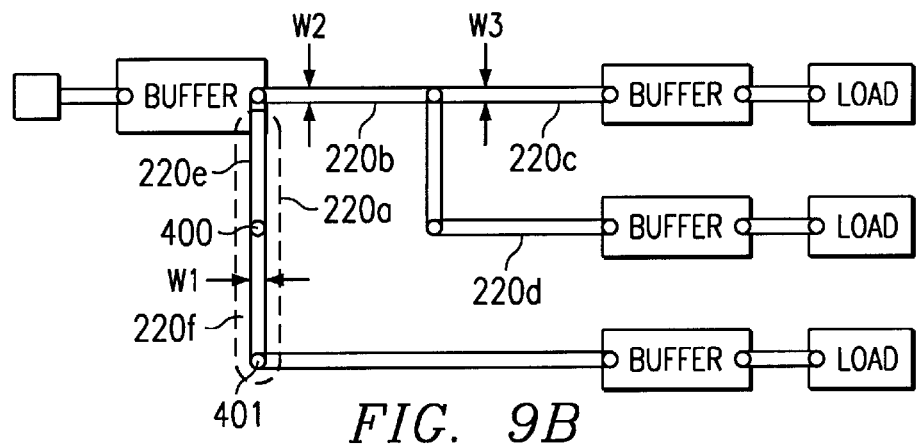
FIG. 9B is a modified trial layout of FIG. 6B with a via added to a signal line to change the impedance of the signal line, according to the present invention.

FIG. 9B is a modified trial layout of FIG. 6B with a via added to a signal line to change the impedance of the signal line, according to the present invention. In some instances, an electromigration analysis according to the present invention may indicate that a signal line width should be increased above a preselected line width. An alternative to increasing the line width is to increase the resistance of the signal line. As discussed with reference to FIGS. 8B and 8C, changing line resistance results in an altered current profile. Thus, by increasing the resistance of a line, the minimum required width for electromigration assurance can be reduced. In FIG. 9B, a via 400 is inserted in line segment 220a to produce two line segments, segment 220e and segment 220f. These two segments are placed on different interconnect layers in the integrated circuit so that via 400 is in series with them. One or more vias can be added in this manner to increase the impedance of line segment 220a. Other means of increasing signal line impedance can also be used, such as increasing length, reducing conductivity, etc.

Alternatively, the capacitance of a signal line can be reduced, according to an aspect of the present invention, in order to lower peak current and thereby improve EM reliability. This can be done by increasing the spacing around the signal line, for example. This can also be done by reducing the number of receivers on the signal line.

According to an aspect of the present invention, it has been determined that many signal lines must be made wider than a minimum signal line width determined by electromigration analysis in order to meet driver/load requirements, or propagation delay requirements. It has been determined that signal lines driven by driver circuits which provide large currents are generally sized according to peak current. It has likewise been determined that signal lines driven by drivers which produce low currents are generally sized according to RMS current.

Returning to FIG. 3, which is a schematic of buffer circuit 110, an aspect of the present invention will now be described in more detail. Output signal line 160 typically carries current in both directions, depending on whether a signal is rising or falling. However, signal lines 161 and 162 carry current in only one direction. It has been determined that electromigration can be compensated somewhat by an alternating current flow. This is included in the electromigration analysis according to the present invention in the equation for average current, which was presented earlier:

$I_{avg} = \max(I_{avg+}, -I_{avg-}) - r^* \min(I_{avg+}, -I_{avg-})$ where: r=0.5 (conservative value)

In this equation, negative current is derated by a factor of 0.5 which is referred to as a "recovery factor." This factor is dependent on the metal technology being used in the integrated circuit.

Referring again to FIG. 3, since current in signal lines 161 and 162 is unidirectional the value for average current in these signal line may be higher than the value for average current in signal line 160. Thus, signal lines 161 and 162 may have a wider minimum width for electromigration analysis than signal line 160.

Figure 10:
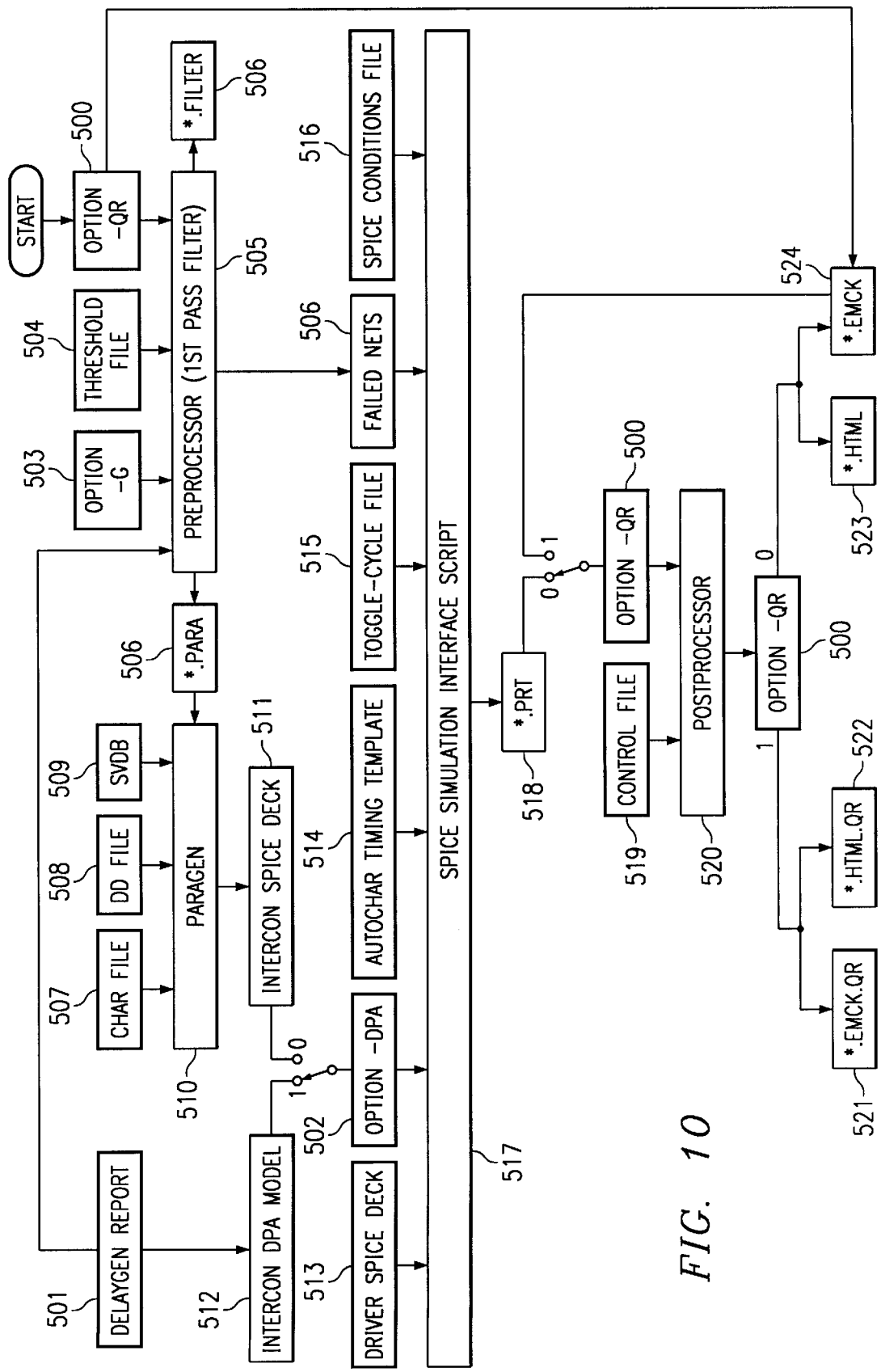
FIG. 10 is a flow chart of a check program to determine a profile of current which will flow in the signal line of FIG. 6B, according to the present invention.

FIG. 10 is a flow chart of the static, signal-EM validation flow, called EmChecker, employed to determine a profile of the current that will flow in the signal line of FIG. 6B, as well as inside the driver, according to the present invention.

The -qr option (500) enables a quick run of the flow on the same database when only the values in the control file have changed; it needs the *.emck output (524) file from a previous run; if there is more than one *.emck file, the -g option (503) determines which one to pick; it is set to 1 to enable.

The delaygen report (501) is the file from which signal name, total capacitance, driver cell type and instance name are extracted; the driver name must be either a valid library cell name or the name of the block being analyzed. The delaygen report also includes the DPA parameters if DPA analysis selected.

There are two choices to represent the interconnect. For pre-layout analysis, the present invention advantageously provides a means to perform EM validation flow without having to wait for the final database; thus, there is an option to switch to the simpler DPA model (512) when the full RC model of the interconnect is not available yet. The -dpa option (502) is set to 1 if the DPA model will be used in the analysis.

Parallel execution of the flow is possible by using the -g option (503) to group signals that fail the first pass. Each group is then submitted to a distributed computer queue server that selects a machine for execution.

The lumped-capacitance threshold file (504) is used to eliminate those nets whose total capacitance is less than a predetermined threshold value. This file lists each cell in the design with a maximum safe lumped capacitance that the cell can drive when connected to a preselected default signal track width. This file is created by performing an EM validation analysis on various driver circuits in a library of cell designs using a preselected output signal track width, which may be different for each of the various cell designs. Based on the signal interconnects internal to the driver cell and the preselected output signal track width, a lumped capacitance threshold value is determined for each cell design that specifies a maximum lumped capacitance that the cell can drive within the EM guidelines when excited by worst-case transition time input signals for all possible input vectors.

The first pass preprocessor (505) employs the lump-capacitance threshold file (504). It compares the total capacitance of the interconnect, as given by the delaygen report, to the driving capability of the driver, as provided by the threshold file, for each and every signal in the block. It is known that lumped load analysis is worst-case, and adding resistance improves the EM performance by reducing peak and RMS currents. Thus, there is no need to analyze EM if it is known that a certain net capacitance is below a threshold value. The output of the preprocessor is a list of failed nets (506) which will be further analyzed.

Also during this pass, if -dpa option (502) is set to 0, Paragen (510) is invoked once to generate SPICE decks (511) for all nets that failed.

The SVDB directory (509), the characterization file (507), and the dummy-devices file (508) are all needed by Paragen. Paragen is an extraction database interface program that will generate the RC network of a selected signal and along with the widths and layers for all resistive elements in the R network.

SPICE simulation needs the driver SPICE deck (513), the Autochar timing template (514), which is basically a truth table to exhaust all possible combinations of the driver inputs, and the operating frequency information from the toggle-cycle file (515). Moreover, the spice conditions file (516) points to transistor models to be used, and contains temperature, supply voltage, and other relevant information for the SPICE simulation (517).

To measure the RMS, AVG, and PEAK current values cycle-by-cycle, the EM validation flow makes use of a SPICE card called .MEASURE that provides timing parameters to a measurement program referred to as CODAC.

When used in function mode, the .MEASURE card in SPICE calls CODAC to measure the average, rms, min, and max values of the output variable. The circuit designer can specify the point at which the function measurement is to begin and be stopped via the .MEASURE card. Thus, it is possible to find these values for each clock cycle.

Then, SPICE prints the results in the print file (518). A Perl script is then used to process the results for display to the circuit designer. Perl is a known script language that is often used in conjunction with SPICE. Other means of producing a human readable output are available and can be used in conjunction with the present invention. Alternatively, a human readable output may be omitted entirely and the entire process of EM evaluation and redesign performed in an automated fashion, according to an aspect of the present invention.

If the -qr option (500) is set to 0, the postprocessor (520) reads the control file (519), which contains EM guideline limits, and the SPICE *.prt file (518), which has the current limits for each cycle of simulation, to check any EM violations.

If the -qr option (500) is set to 1, then the postprocessor needs only the *.emck file from a previous run. With this option the circuit designer can rerun the flow with a new control file having different current density values without repeating the time-consuming SPICE simulations.

The flow creates three output files: <blockname>.filter (506), <blockname>.emck (524) or <blockname>.emck.qr (521), and <blockname>.html (523) or <blockname>.html.qr (522), depending on the -qr option.

The first file lists the names and total number of signal nets that failed the first-pass filter. This file is available immediately after the first pass in few minutes.

The second one is the actual output with all the current and line width information.

Upon completion of the analysis, if the corresponding switch, -ns, is turned on (1), the script invokes Netscape, a known color coded text formatting program, with the latter file loaded to provide a summary of definite segment EM failures shown in a color-coded format.

In summary, basic features and advantages of EmChecker of the present invention are as follows:

All possible I/O combinations are checked in response to a properly designed timing template.

Peak, average, RMS currents are calculated; peak current limit for bamboo-width is checked as well (peak exception for W<0.5 $\mu$m).

It has a first-pass filter based on lump capacitance, on the observation that lumped load analysis is always worst-case, and adding resistance improves EM results. Therefore, if it is known that a certain net capacitance is below a threshold value, there is no need to analyze EM in SPICE.

Interconnect lines inside the drivers are checked.

Actual input-edge slew rates can be used if supplied through the input slew-rate file. The flow uses actual input transition times from the same layout that was used to setup the analysis. Input transition times are determined by use of the RICE delay calculator, delaygen. This yields much reduced peak currents compared to using a fast input transition time, since a fast transition time signal produces higher peak currents which imply a pessimistic EM condition. The EM validation flow has the ability to set the signal frequency on a signal-by-signal basis.

Every element of the RC network for each signal that fails the first pass is verified to be within the guidelines.

Parallel execution of the flow is possible by grouping signals that fail the first pass.

A quick run of the flow is possible when only the values in the control file have changed and there is no need for SPICE simulations.

For pre-layout analysis, an interconnect net can be collapsed to its DPA model and the required width or required via count at the output of the driver determined. If this is done with parasitic estimates from a prelayout tool like a floorplanner which provides approximate placement information, the initial layout can be correct by construction through directing the router to route critical signals wide and with increased VIA counts. In this mode, advantages of the present invention are obtained without the step of modifying a trial layout. In this mode, various design parameters are determined so that a first construction of the design is guaranteed to meet the design goals. In this case, the first 'trial' layout would be guaranteed to be correct because a pessimistic first look at the route is taken and a required track width based on parasitic estimates is pre-calculated before starting the layout.

The signal-EM validation flow requires seventeen parameters which are supplied by the circuit designer prior to starting a validation flow session. These parameters are defined in Table 6.

TABLE 6

EM Checker Parameters

| Parameter | Name | Description |
|---|---|---|
| -b | <block> | the block name |
| -th | <threshold> | the lumped-capacitance threshold file used to eliminate those nets whose total capacitance is less than the driver can drive |
| -d | <delaygenfile> | the delaygen report file from which signal name, total capacitance, driver and source names are extracted; the driver name must be either a valid library cell name or the name of the block being analyzed |
| -a | <autochardir> | the directory where the AutoChar-generated truth tables for all the library cells reside! the tool can scan multiple directories to find the table |
| -sp | <spicecrktdir> | the directory where all the SPICE subcircuits for the library cells and the corresponding .rwl files with resistor-width info reside! the tool can scan multiple directories for the subcircuits |
| -sm | <spicemodlefile> | SPICE conditions file which points to the SPICE model to be used and contains temperature, supply voltage, and other relevant information |
| -sd | <spicedeckdir> | the subdirectory to be created to store all SPICE files generated during the exectution of the flow |
| -is | <inputslewfile> | the file with input edge-rate information, as generated by Pwb1.0; the circuit designer also specifies in the control file a default transition time for all inputs |
| -tc | <togglecycfile> | the file with toggle frequency information to have the ability to set the frequency on a signal-by-signal basis; the circuit designer also specifies in the controlfile a default toggle cycle for all signals |
| -c | <controller> | the control file with all the current density, width reduction and other information such as the default cycle time, default input transition time, and a list of non-drivers that are represented in the database as boxes and hence not to be included in the analysis |
| -db | <svdbdir> | the directory where SVDB resides, which is needed by Paragen during the first pass to generate SPICE decks for failed nets |
| -cf | <charfile> | the characterization file needed by Paragen |
| -dd | <dummydefile> | the dummy devices file needed by Paragen |
| -g | <G1:G2> | G1 and G2 specify the group number and the number of signals in the group, respectively; for example, 2:24 would analyze the second group of 24 signals that failed the first pass; this way it is possible to submit parallel jobs through DQS for faster execution; if no grouping is desired, then G1 is set to 0, and G2 is a don't care |
| -qr | <quickrunopt> | option to enable a quick run of the flow on the same database when only the values in the control file have changed; it needs the *.emck file from a previous run; if there is more than one *.emck file, the -g option determines which one to pick; set to 1 to enable |
| -dpa | 21 dpaopt> | option to enable pre-layout analysis, with the DPA model representing the interconnect; set to 1 to enable |
| -ns | <netscapeopt> | option to enable or disable the Netscape invocation at the end of the analysis; set to 1 to enable |

Figure 11:
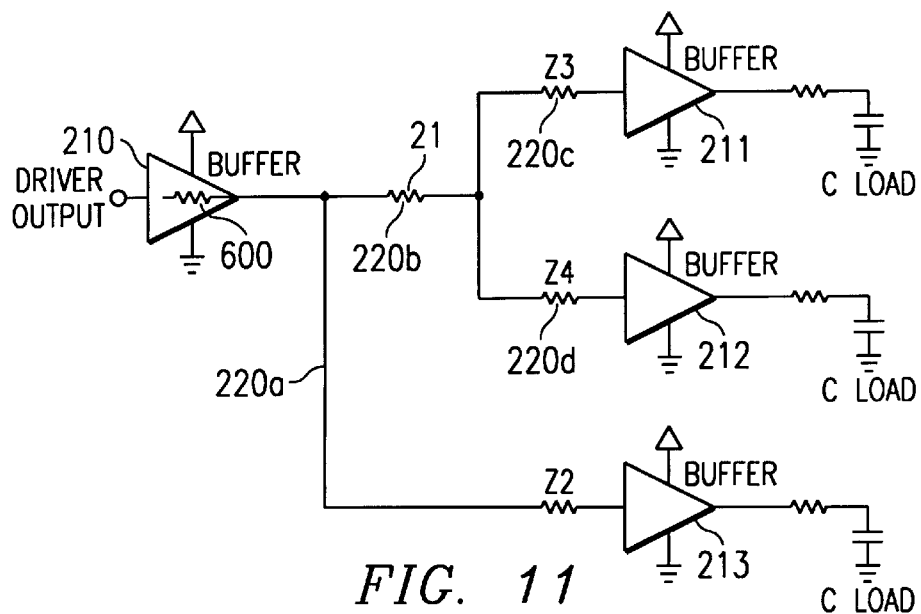
FIG. 11 is an equivalent model of the circuit of FIG. 6A for transmission line analysis, according to an aspect of the present invention.

FIG. 11 is an equivalent model of the circuit of FIG. 6A for a transmission line analysis, according to an aspect of the present invention. As is known, when the rise time of a signal is less than the propagation delay of the signal on a signal line interconnect, then the dynamic characteristics of the signal can be analyzed using transmission line theory. Referring to FIG. 11, buffer 210 has a characteristic output impedance which is determined by the physical parameters of buffer 210. Each portion of signal line interconnect 220 has a characteristic impedance Z1–Z4 determined by the physical parameters of the signal line, including distributed capacitance, inductance and resistance. Each receiver 211–213 has in input impedance which is primarily capacitive if the input is to the gate of an MOS transistor. Each line segment 220a–220b has a length that is determined after the completion of the trial layout, as indicated in FIG. 6B. Thus, by applying known transmission line analysis techniques, a profile of current flowing in each line segment 220a–220d can be readily determined. These current profiles include peak current, RMS current, and average current. Having determined current profiles in this manner, an electromigration analysis is completed as described with reference to FIGS. 8A–8D.

Figure 12A:
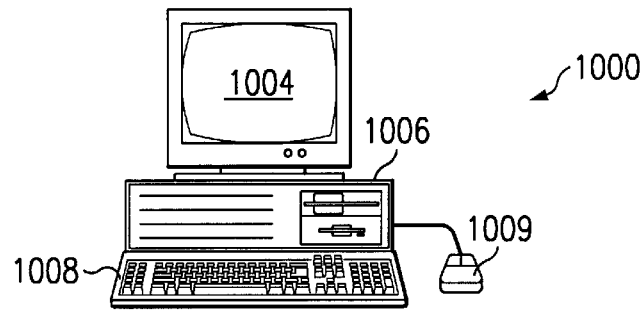
FIG. 12A is an illustration of a computer system which contains a design program incorporating aspects of the present invention.
Figure 12B:
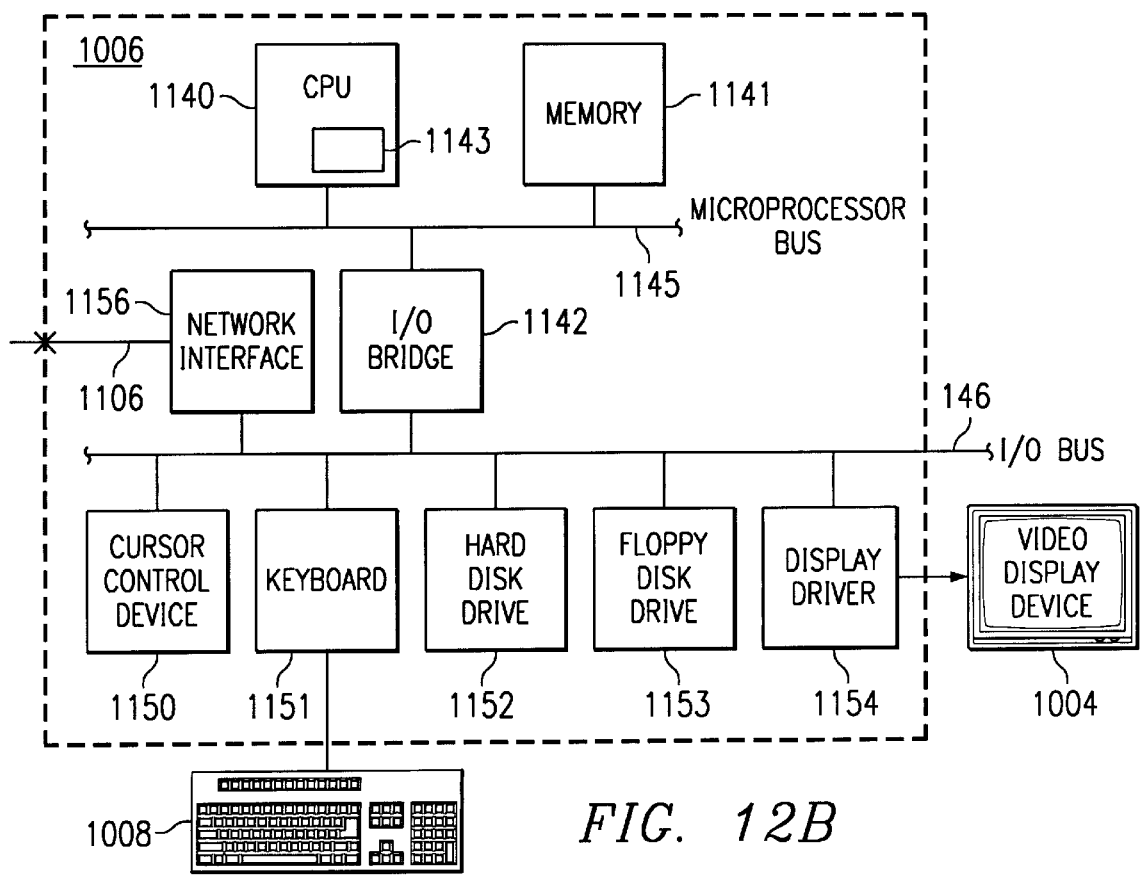
FIG. 12B is a block diagram of the computer of FIG. 12A.

FIG. 12A is an illustration of a computer system 1000 which contains a design program according to an aspect of the present invention; and FIG. 12B is a block diagram of the computer of FIG. 12A. A design program which contains the steps for performing electromigration analysis according to aspects of the present invention, as described in the previous paragraphs, is stored on hard drive 1152. This design program can be introduced into computer 1000 via a diskette installed in floppy disk drive 1153, or down loaded via network interface 1156, or by other means. The program is transferred to memory 1141 and instructions which comprise the program are executed by processor 1140. A trial layout of an integrated circuit is displayed on monitor 1004. A profile of a current which will flow in the signal line during operation of the integrated circuit is determined by simulating the operation of the trial layout using a distributed load simulation. A minimum width for the signal line to maintain electromigration at an acceptable level is selected in accordance with the profile of current. These results of an electromigration analysis according to the present invention are displayed on monitor 1004. Based on this, the trial layout is modified in response to the step of selecting a minimum width to create a final layout. Alternatively, the design program can cause the trial layout to be modified in response to the step of selecting a minimum width without displaying intermediate results on monitor 1004.

Once an integrated circuit is designed using the design program on computer system 1000, the integrated circuit is fabricated according to the modified trial layout. Fabrication of the integrated circuit involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

Another embodiment of the present invention includes distributed inductance of signal line interconnects in the distributed load simulation model. Inductive effects become more important as signal line interconnect resistance is reduced, by using copper interconnects, for example.

An advantage of the present invention is that the minimum width of a signal line interconnect can be reduced significantly over that required by prior art electromigration analysis by creating a trial layout prior to performing electromigration analysis. This permits more signal lines to be routed in a given amount of area on an integrated circuit. Conversely, less space on an integrated circuit is needed for signal line interconnects.

Another advantage of the present invention is that various portions of a signal line can be optimized with different minimum widths.

Another advantage is the ability to analyze ALL nets on a large design in a relatively short period of time.

As used herein, the terms "applied," "connected," and "connection" mean electrically connected, including where additional elements may be in the electrical connection path.

While the invention has been described with reference to illustrative embodiments, this description is not intended to be construed in a limiting sense. For example, the term "buffer" and "driver" has been used herein, but these terms are not terms of limitation. Aspects of the present invention are applicable to any circuit that produces a signal for transmission over a signal line or interconnect net. Various other embodiments of the invention will be apparent to persons skilled in the art upon reference to this description.

For example, line width is not the only failure parameter that can be controlled. Insufficient VIA count can also cause failures that can be addressed by any of the repair methods mentioned.

The EM validation flow is also applicable to tapered signal lines or in determining where tapers can be put in. Beneficial tapering can be done either toward or away form the driver. If tapered smaller at the driver, this increases the resistance and thus reduces peak current. If tapered larger at the driver, this increases width and thus reduces current density.

While an analysis based on a current profile that includes peak current, average current and RMS current has been described, other more complicated current waveforms and parameters can be used to perform EM validation, according to an aspect of the present invention.

It is therefore contemplated that the appended claims will cover any such modifications of the embodiments as fall within the true scope and spirit of the invention.

What is claimed is:

1. A method for designing an integrated circuit which has at least one net with at least one driver circuit operable to drive a signal line, comprising the steps of:

estimating parasitic parameters of the net wherein the signal line has a preselected width;

determining a profile of a current which will flow in a segment of the signal line during operation of the integrated circuit in view of the parasitic parameters by simulating the operation of the net in response to an input signal using a distributed load simulation model;

selecting a minimum width for the segment of the signal line to maintain electromigration at an acceptable level in accordance with the profile of current; and creating a layout of the integrated circuit by using the selected minimum width for the segment of the signal line of the net.

2. The method of claim 1, wherein the step of estimating comprises creating a trial layout for the net; and further comprising modifying the trial layout in response to the step of selecting a minimum width to create a final layout.

3. The method of claim 2, wherein the step of modifying the trial layout comprises changing the width of the segment of the signal line from the preselected width to the minimum width.

4. The method of claim 2, wherein the step of modifying the trial layout comprises increasing an impedance of the segment of the signal line having a selected minimum width, whereby a current which will flow in the segment of the signal line is reduced to thereby reduce electromigration.

5. The method of claim 4, wherein the step of increasing impedance comprises adding at least one via in series with the segment of the signal line.

6. The method of claim 2, wherein the step of modifying the trial layout comprises reducing parasitic capacitance of the segment of the signal line having a selected minimum width, whereby a current which will flow in the segment of the signal line is reduced to thereby reduce electromigration.

7. The method of claim 2, further comprising:
determining an actual input transition time for the input signal with reference to the trial layout; and
wherein the step of determining a profile further comprises using the actual input transition time of the input signal.

8. The method of claim 1, wherein the step of determining a profile of a current comprises determining a peak current which will flow in the segment of the signal line during operation of the integrated circuit by simulating the operation of the net using a distributed load simulation model.

9. The method of claim 8, wherein the step of determining a profile of a current further comprises determining an RMS current which will flow in the segment of the signal line during operation of the integrated circuit by simulating the operation of the net using a distributed load simulation model.

10. The method of claim 9, wherein the step of determining a profile of a current further comprises determining an average current which will flow in the segment of the signal line during operation of the integrated circuit by simulating the operation of the net using a distributed load simulation model, wherein average current that will flow in the signal line is calculated by determining a maximum average current that will flow in a first direction in the segment of the signal line, determining a minimum average current that will flow in an opposite direction in the segment of the signal line, derating the minimum average current by a factor and then subtracting the derated minimum average current from the maximum average current; and
wherein the step of selecting a minimum width for the segment of the signal line is in accordance with the peak current, the RMS current and the average current which will flow in segment the signal line.

11. The method of claim 10, wherein the distributed load simulation model is a transmission line simulation model.

12. The method of claim 10, wherein the distributed load simulation model is a driving point admittance simulation model.

13. The method of claim 1, wherein the integrated circuit has a plurality of nets, further comprising the steps of:
repeating the step of estimating parasitic parameters for each of the plurality of nets;
eliminating from consideration at least a first one of the plurality of nets by determining if a lumped capacitance of the first net is less than a maximum safe lumped capacitance that the first driver can drive;
repeating the steps of determining a profile and selecting a minimum width for each of the remaining plurality of nets.

14. The method of claim 13, wherein the step of determining a profile further comprises simulating the operation of the plurality of nets by distributing the nets to a plurality of computer systems interconnected via a network.

15. The method of claim 1, wherein the step of estimating further comprises using a prelayout tool to estimate a physical configuration of the net, whereby an initial layout formed in response to the step of selecting a minimum width is correct by construction.

16. The method of claim 1, wherein the net has at least one via or contact, further comprising validating reliable operation of the at least one via or contact in accordance with the profile of current.

17. The method of claim 1, wherein the step of selecting a minimum width further comprises selecting a width which tapers.

18. The method of claim 1, wherein the net includes a plurality of receiver circuits, wherein:
the step of determining further comprises determining a profile of a first current which will flow in a first segment of the signal line during operation of the integrated circuit and determining a profile of a second current which will flow in a second segment of the signal line during operation of the integrated circuit by simulating the operation of the net using a distributed load simulation model; and
the step of selecting comprises selecting a minimum width for the first segment of the signal line to maintain electromigration at an acceptable level in accordance with the profile of the first current and selecting a minimum width for the second segment of the signal line to maintain electromigration at an acceptable level in accordance with the profile of the second current.

19. A method for fabricating an integrated circuit which has at least one net with at least one driver circuit operable to drive a signal line, comprising the steps of:
estimating parasitic parameters of the net wherein the signal line has a preselected width;
determining a profile of a current which will flow in a segment of the signal line during operation of the integrated circuit in view of the parasitic parameters by simulating the operation of the net using a distributed load simulation model;
selecting a minimum width for the segment of the signal line to maintain electromigration at an acceptable level in accordance with the profile of current;
creating a layout of the integrated circuit by using the selected minimum width for the segment of the signal line of the net; and
fabricating the integrated circuit according to the layout.

20. A computer system, comprising:
a processor for processing instructions;
a memory circuit for holding instructions connected to the processor;
a mass storage device for holding a program operable to transfer the program to the memory circuit;
wherein a design program stored on the mass storage device comprises instructions for designing an integrated circuit which has at least one net with at least one driver circuit operable to drive a signal line, comprising the steps of:
estimating parasitic parameters of the net wherein the signal line has a preselected width;
determining a profile of a current which will flow in a segment of the signal line during operation of the integrated circuit in view of the parasitic parameters by simulating the operation of the net using a distributed load simulation model;
selecting a minimum width for the segment of the signal line to maintain electromigration at an acceptable level in accordance with the profile of current; and creating a layout of the integrated circuit by using the selected minimum width for the segment of the signal line of the net.

21. A mass storage device for holding a computer program, wherein a design program stored on the mass storage device comprises instructions for designing an integrated circuit which has at least one net with at least one driver circuit operable to drive a signal line, comprising the steps of:

estimating parasitic parameters of the net wherein the signal line has a preselected width;

determining a profile of a current which will flow in a segment of the signal line during operation of the integrated circuit in view of the parasitic parameters by simulating the operation of the net using a distributed load simulation model;

selecting a minimum width for the segment of the signal line to maintain electromigration at an acceptable level in accordance with the profile of current; and creating a layout of the integrated circuit by using the selected minimum width for the segment of the signal line of the net.

22. The mass storage device of claim 21, wherein the mass storage device comprises a diskette.

* * * * *